US012765389B2

(12) United States Patent
Yoshimi et al.

(10) Patent No.: US 12,765,389 B2
(45) Date of Patent: Oct. 13, 2026

(54) RADIO-FREQUENCY MODULE

(71) Applicant: Murata Manufacturing Co., Ltd., Kyoto-fu (JP)

(72) Inventors: Shunji Yoshimi, Nagaokakyo (JP); Mitsunori Samata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 1099 days.

(21) Appl. No.: 17/546,681

(22) Filed: Dec. 9, 2021

(65) Prior Publication Data

US 2022/0189893 A1 Jun. 16, 2022

(30) Foreign Application Priority Data

Dec. 11, 2020 (JP) ................................. 2020-205984

(51) Int. Cl.
*H10W 44/20* (2026.01)
*H03F 3/195* (2006.01)
(Continued)

(52) U.S. Cl.
CPC ............ *H10W 44/20* (2026.01); *H03F 3/195* (2013.01); *H04B 1/44* (2013.01); *H10W 40/22* (2026.01);
(Continued)

(58) Field of Classification Search
CPC ..................... H01L 23/66; H01L 25/16; H01L 2223/6611; H01L 2223/6655; H01L 2223/6672; H01L 24/11; H01L 24/13; H01L 24/16; H01L 24/81; H01L 2224/13082; H01L 2224/16227; H01L 2224/16235; H01L 2224/32145; H01L 2224/73253; H01L 2224/73251;
(Continued)

(56) References Cited

U.S. PATENT DOCUMENTS

| | | | | | |
|---|---|---|---|---|---|
| 6,864,585 | B2 * | 3/2005 | Enquist | H01L 21/76898 | 257/E21.597 |
| 7,514,774 | B2 * | 4/2009 | Leung | H01L 23/552 | 257/691 |
| 7,706,756 | B2 * | 4/2010 | Sato | H03F 3/72 | 333/100 |
| 8,546,927 | B2 * | 10/2013 | Shiroki | G06K 19/07754 | 257/679 |
| 11,539,138 | B2 * | 12/2022 | Kim | H01Q 21/08 | |
| 11,799,503 | B2 * | 10/2023 | Goto | H04B 1/0057 | |
| 2007/0176298 | A1 * | 8/2007 | Osone | H01L 23/3677 | 257/E23.125 |

(Continued)

*Primary Examiner* — Chad M Dicke
*Assistant Examiner* — Mario Andres Autore, Jr.
(74) *Attorney, Agent, or Firm* — Studebaker Brackett PLLC

(57) ABSTRACT

A semiconductor device including a radio-frequency amplifier circuit and a band selection switch is mounted on or in a module substrate. An output matching circuit coupled between the radio-frequency amplifier circuit and the band selection switch is on or in the module substrate. The semiconductor device includes a first member at which the band selection switch having a semiconductor element made of an elemental semiconductor is formed and a second member joined to the first member in surface contact therewith. The radio-frequency amplifier circuit including a semiconductor element made of a compound semiconductor is formed at the second member. Conductive protrusions are raised from first and second members. The semiconductor device is mounted on or in the module substrate with the conductive protrusions interposed therebetween, and in plan view, is in close proximity to the output matching circuit or overlaps a passive element constituting the output matching circuit.

7 Claims, 10 Drawing Sheets

(51) Int. Cl.
*H04B 1/44* (2006.01)
*H10W 40/22* (2026.01)
*H10W 90/00* (2026.01)

(52) U.S. Cl.
CPC ....... *H10W 90/00* (2026.01); *H03F 2200/451* (2013.01); *H10W 44/206* (2026.01); *H10W 44/231* (2026.01); *H10W 44/234* (2026.01); *H10W 44/241* (2026.01)

(58) Field of Classification Search
CPC ........... H01L 2224/73257; H01L 2224/73265; H01L 27/0623; H01L 27/0635; H01L 27/0688; H01L 29/6631; H01L 29/66318; H01L 21/8248; H01L 21/8249; H03F 3/195; H03F 2200/451; H04B 1/44; H10W 44/20
See application file for complete search history.

(56) References Cited

U.S. PATENT DOCUMENTS

| | | | | |
|---|---|---|---|---|
| 2007/0210866 | A1* | 9/2007 | Sato | H03F 3/195<br>330/126 |
| 2012/0280755 | A1* | 11/2012 | Wright | H03F 3/195<br>330/307 |
| 2015/0054038 | A1* | 2/2015 | Masliah | H03F 1/223<br>257/262 |
| 2015/0303971 | A1* | 10/2015 | Reisner | H01L 23/66<br>330/307 |
| 2017/0026071 | A1* | 1/2017 | Young | H01L 23/66 |
| 2018/0233604 | A1* | 8/2018 | Gu | H10D 1/64 |
| 2019/0341381 | A1* | 11/2019 | Dutta | H10D 62/824 |
| 2020/0176416 | A1* | 6/2020 | Ketterson | H01L 23/3128 |
| 2020/0359507 | A1* | 11/2020 | Chikita | H05K 3/4697 |
| 2021/0066252 | A1* | 3/2021 | Chen | H01L 23/481 |
| 2021/0313284 | A1* | 10/2021 | Noori | H01L 23/66 |

* cited by examiner

RADIO-FREQUENCY MODULE

CROSS-REFERENCE TO RELATED APPLICATION

This application claims benefit of priority to Japanese Patent Application No. 2020-205984, filed Dec. 11, 2020, the entire content of which is incorporated herein by reference.

BACKGROUND

Technical Field

The present disclosure relates to a radio-frequency module.

Background Art

Radio-frequency (RF) front-end modules capable of both transmitting and receiving radio-frequency signals are installed in electronic devices for communications such as mobile communications and satellite communications. An RF front-end module includes, for example, a monolithic microwave integrated circuit (MMIC) capable of amplifying radio-frequency signals, a control integrated circuit (IC) for controlling a radio-frequency amplifier circuit, a switch IC, and a duplexer.

U.S. Patent Application Publication No. 2015/0303971 discloses a radio-frequency module miniaturized by stacking a control IC on an MMIC. The radio-frequency module disclosed in U.S. Patent Application Publication No. 2015/0303971 includes the MMIC mounted on a module substrate and the control IC stacked on the MMIC. Electrodes of the MMIC, electrodes of the control IC, and electrodes on the module substrate are electrically coupled to each other by wire bonding.

SUMMARY

In a radio-frequency amplifier circuit, for example, a heterojunction bipolar transistor (HBT) is utilized. While an HBT operates, the HBT generates heat because collector dissipation occurs. A temperature rise of the HBT caused by heat generation in turn increases collector current. When conditions for this positive feedback are satisfied, thermal runaway occurs in the HBT. To avoid thermal runaway in the HBT, an upper limit of output power of the HBT is set.

To implement radio-frequency amplifier circuits with high power output, it is desirable to improve the characteristic of heat released from a semiconductor device including, for example, an HBT. It is difficult to satisfy recent demand for radio-frequency amplifier circuits with high power output by using the radio-frequency module disclosed in U.S. Patent Application Publication No. 2015/0303971. Additionally, when the operating frequency is relatively high, loss in signal transfer tends to increase. Accordingly, the present disclosure provides a radio-frequency module capable of suppressing increases in signal transfer loss and also improving the characteristic of heat released from a semiconductor device.

An aspect of the present disclosure provides a radio-frequency module including a module substrate, a semiconductor device mounted on or in the module substrate and including a radio-frequency amplifier circuit and a band selection switch, and an output matching circuit disposed on or in the module substrate and coupled between the radio-frequency amplifier circuit and the band selection switch. The band selection switch is configured to output from a contact selected from a plurality of contacts an inputted radio-frequency signal. The semiconductor device further includes a first member including the band selection switch including a semiconductor element made of an elemental semiconductor, a second member joined to the first member in surface contact with the first member, the second member including the radio-frequency amplifier circuit including a semiconductor element made of a compound semiconductor, and a plurality of conductive protrusions arranged at positions included in the first member or the second member in plan view. The semiconductor device is mounted on or in the module substrate with the plurality of conductive protrusions interposed between the semiconductor device and the module substrate such that the second member faces the module substrate. The semiconductor device is disposed in close proximity to the output matching circuit in plan view, or the semiconductor device overlaps at least one passive element constituting the output matching circuit in plan view.

The second member including the radio-frequency amplifier circuit is joined to the first member including the band selection switch, and consequently, the radio-frequency module can be smaller than if the radio-frequency amplifier circuit and the band selection switch are individually mounted on or in the module substrate. Two heat transfer paths are formed; one is a heat transfer path from the semiconductor element included in the radio-frequency amplifier circuit to the first member; and the other is a heat transfer path from the semiconductor element to the module substrate via the conductive protrusion. As a result, it is possible to improve the characteristic of heat released from the semiconductor element included in the radio-frequency amplifier circuit.

No circuit component except the components constituting the output matching circuit is disposed between the passive element included in the output matching circuit and the semiconductor device in plan view, or the passive element constituting the output matching circuit overlaps the semiconductor device in plan view. As a result, it is possible to close the distance between the semiconductor device and the output matching circuit. Consequently, it is possible to close the distance from each of the radio-frequency amplifier circuit and the band selection switch that are disposed in the semiconductor device to the output matching circuit. Because this shortens the transfer line from the radio-frequency amplifier circuit to the output matching circuit and the transfer line from the output matching circuit to the band selection switch, it is possible to reduce transfer loss.

DETAILED DESCRIPTION

First Embodiment

A radio-frequency module according to a first embodiment will be described with reference to drawings in FIGS. 1A to 5D.

Figure 1A:
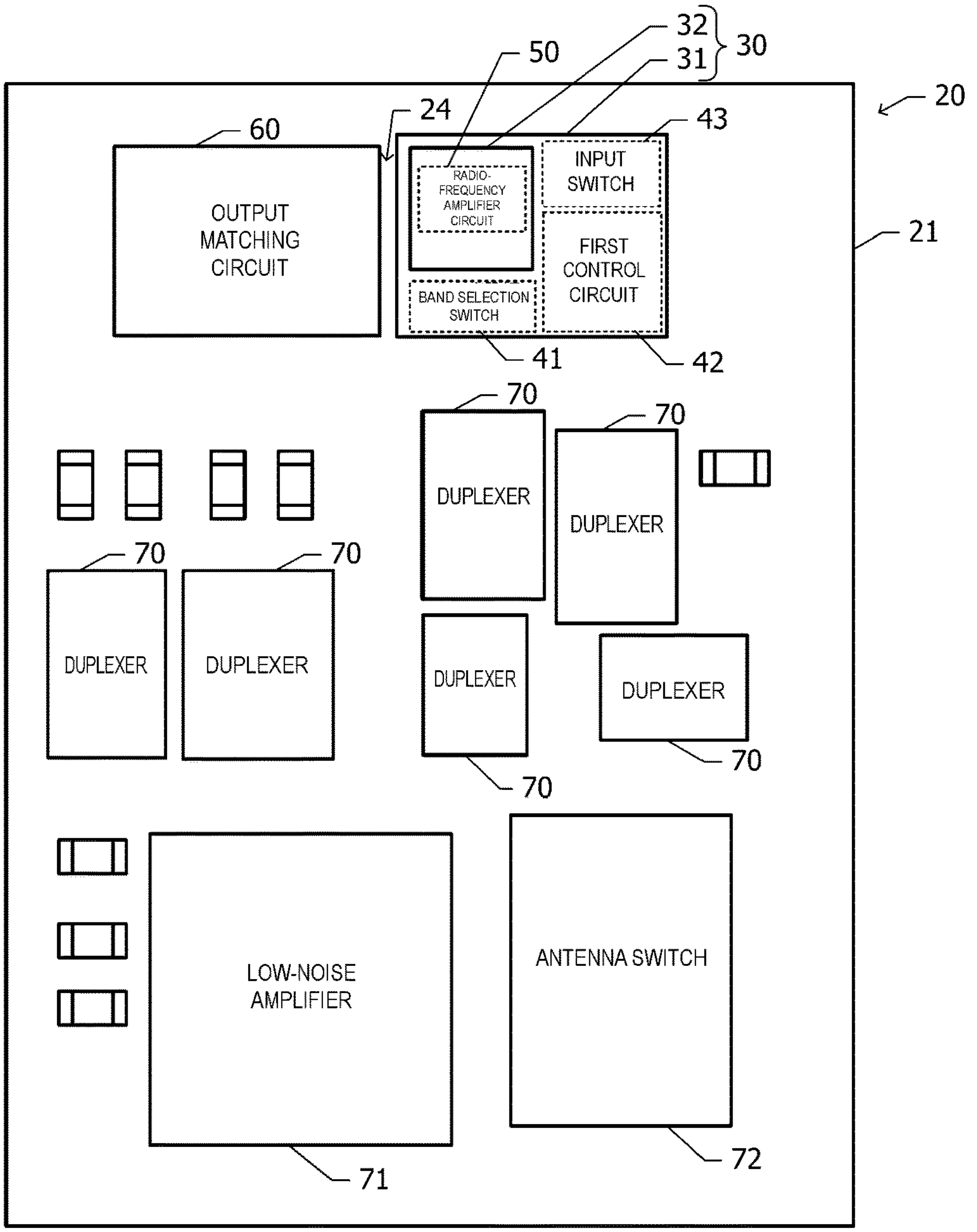
FIG. 1A illustrates an arrangement of constituent elements of a radio-frequency module according to a first embodiment in plan view.
Figure 1B:
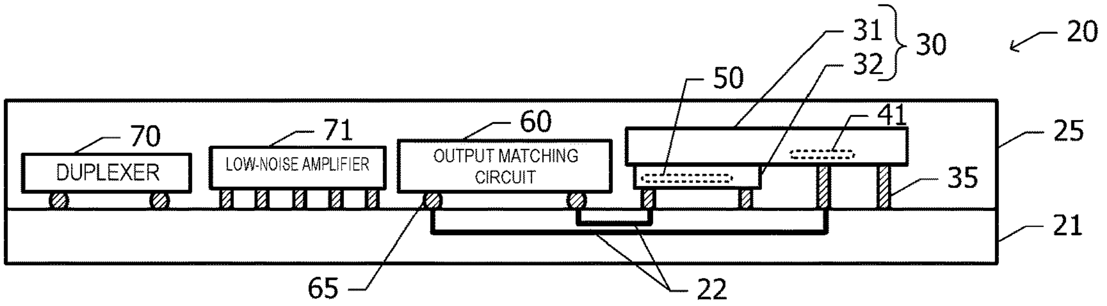
FIG. 1B schematically illustrates a sectional structure of the radio-frequency module.

FIG. 1A illustrates an arrangement of constituent elements of a radio-frequency module 20 according to the first embodiment in plan view. FIG. 1B schematically illustrates a sectional structure of the radio-frequency module 20. On a module substrate 21, a semiconductor device 30, an output matching circuit 60, a plurality of duplexers 70, a low-noise amplifier 71, an antenna switch 72, and other surface-mount passive elements (surface-mount devices (SMDs)) are mounted. The semiconductor device 30 includes a first member 31 and a second member 32 joined to the first member 31 in surface contact with the first member 31. The first member 31 may be made of, for example, an elemental semiconductor. The second member 32 may be made of, for example, a compound semiconductor.

A band selection switch 41, a first control circuit 42, and an input switch 43 are provided at the first member 31. The first member 31 includes a semiconductor substrate made of an elemental semiconductor such as a silicon substrate or silicon on insulator (SOI) substrate. The band selection switch 41, the first control circuit 42, and the input switch 43 are implemented by, for example, semiconductor elements made of an elemental semiconductor at a surface layer portion of the semiconductor substrate.

A radio-frequency amplifier circuit 50 is provided at the second member 32. The second member 32 includes, for example, an underlying semiconductor layer made of a compound semiconductor such as GaAs and a semiconductor element disposed on or in the underlying semiconductor layer. The semiconductor element is made from a compound semiconductor and may be, for example, a heterojunction bipolar transistor (HBT). The radio-frequency amplifier circuit 50 is implemented by, for example, a semiconductor element made of a compound semiconductor.

The output matching circuit 60 is implemented by an integrated passive device (IPD) having passive elements including, for example, an inductor and a capacitor. The output matching circuit 60 may be implemented by combining a plurality of surface-mount passive elements.

The second member 32 is included in the first member 31 in plan view. The semiconductor device 30 has a plurality of conductive protrusions 35 arranged at positions within the first member 31 or the second member 32 in plan view. The plurality of conductive protrusions 35 are raised from the first member 31 or the second member 32 to the module substrate. The semiconductor device 30 is flip-chip mounted on or in the module substrate 21 with the plurality of conductive protrusions 35 therebetween in such a manner that the second member 32 faces the module substrate 21. Cu pillar bumps formed by depositing solder on the top surfaces of raised portions made of Cu are used as the plurality of conductive protrusions 35. Structures without depositing solder on the top surface such as Au bumps may be used as the conductive protrusions 35. Raised portions structured in such manners are also referred to as "pillar". Alternatively, structures formed by standing conductive columns on pads may be used as the conductive protrusions 35. Conductive protrusions structured in such a manner are also referred to as "post". Ball bumps formed in a ball shape by reflow soldering may be used as the conductive protrusions 35. In addition to these various structures, various other structures including conductors raised from a substrate may be used as the conductive protrusions 35.

The low-noise amplifier 71 is flip-chip mounted on or in the module substrate 21 with a plurality of conductive protrusions interposed therebetween. The output matching circuit 60 and the plurality of duplexers 70 are flip-chip mounted on or in the module substrate 21 with solder bumps 65 interposed therebetween. These bumps for flip-chip mounting are an example, and bumps structured in other manners may also be used. For example, Au bumps may be used. The electronic components mounted on or in the module substrate 21 are sealed by a molding resin 25.

An output port of the radio-frequency amplifier circuit 50 provided at the second member 32 of the semiconductor device 30 is coupled to the output matching circuit 60 via the conductive protrusion 35, a wire 22 in the module substrate 21, and the solder bump 65 of the output matching circuit 60. The output matching circuit 60 is further coupled to the band selection switch 41 provided at the first member 31 via another solder bumps 65, another wire 22 in the module substrate 21, and the conductive protrusion 35 raised from the first member 31. The wires 22 are constituted by metal patterns included in a plurality of wiring layers arranged in the module substrate 21 and a plurality of vias connecting the wiring layers.

The semiconductor device 30 is disposed in close proximity to the output matching circuit 60 in plan view. Here, the expression "the semiconductor device 30 is disposed in close proximity to the output matching circuit 60" denotes that the shortest distance from the semiconductor device 30 to the output matching circuit 60 is shorter than the shortest distance from the semiconductor device 30 to another circuit component such as the duplexer 70. When the shortest distance from the semiconductor device 30 to the output matching circuit 60 is shorter than the shortest distance from the semiconductor device 30 to the duplexer 70, high isolation can be achieved for transmission and reception.

It is preferable that the semiconductor device 30 and the output matching circuit 60 be directly next to each other in plan view. It is preferable that no circuit component is disposed in an area 24 between the semiconductor device 30 and the output matching circuit 60.

When the output matching circuit 60 is implemented by a plurality of surface-mount passive elements, no circuit component is disposed in the area between the semiconductor device 30 and a closest passive element of the plurality of surface-mount passive elements constituting the output matching circuit 60 to the semiconductor device 30. When the output matching circuit 60 includes a plurality of surface-mount passive elements, the output matching circuit 60 is formed by these passive elements and wires connecting these passive elements to each other. It should be noted that the output matching circuit 60 do not include wires connecting these passive elements and circuit components other than the output matching circuit 60.

When the output matching circuit 60 is implemented by a single IPD, no circuit component is disposed between one passive element forming the output matching circuit 60, that is, the IPD and the semiconductor device 30. In this case, when a plurality of passive elements including, for example, a capacitor and an inductor included in the single IPD forming the output matching circuit 60 are brought into focus, no circuit component is disposed in the area between the semiconductor device 30 and a closest passive element of the plurality of passive elements included in the output matching circuit 60 to the semiconductor device 30.

Figure 2:
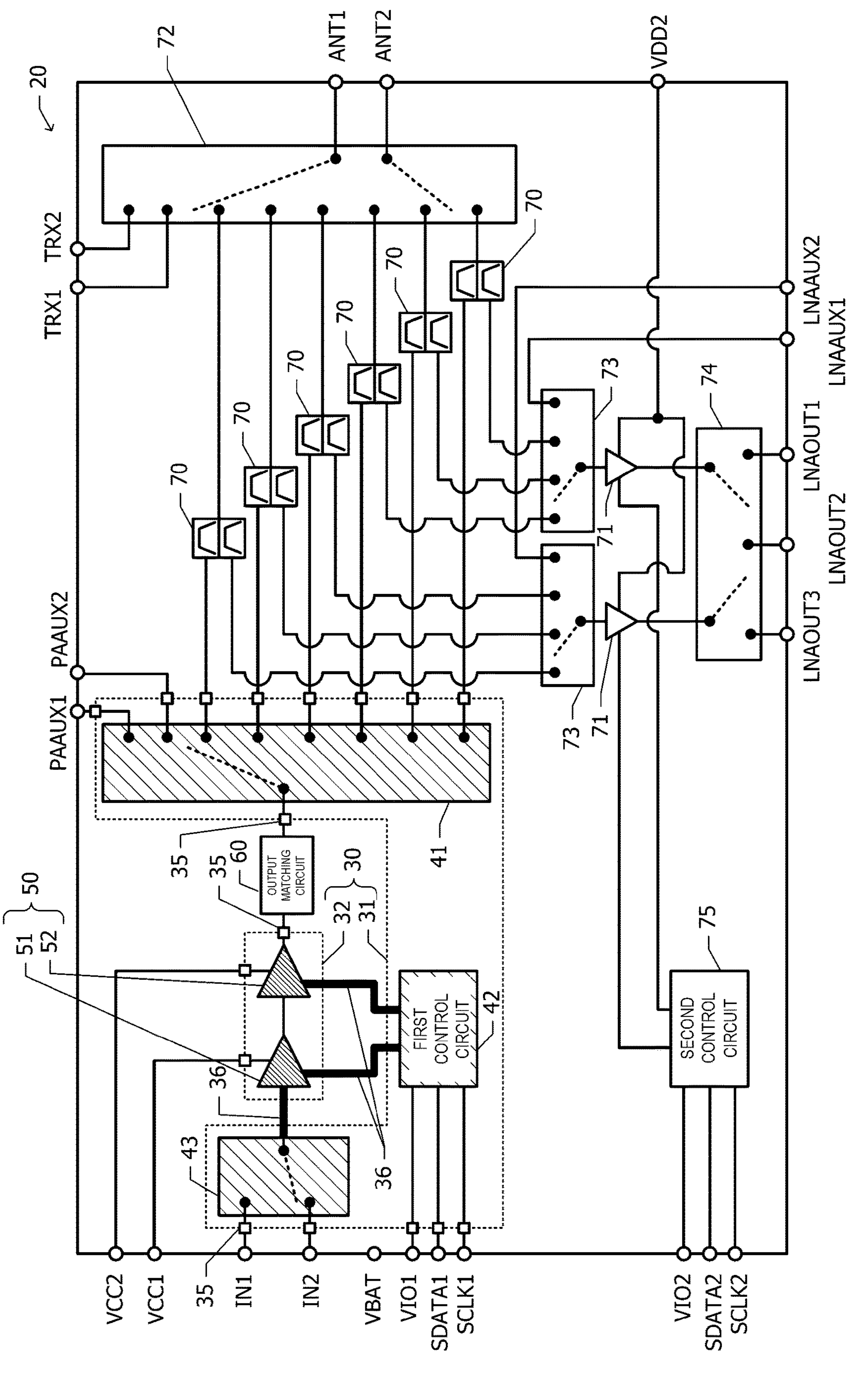
FIG. 2 is a block diagram illustrating a circuit configuration of the radio-frequency module according to the first embodiment.

FIG. 2 is a block diagram illustrating a circuit configuration of the radio-frequency module 20 according to the first embodiment. The radio-frequency module 20 includes the semiconductor device 30 mounted on or in the module substrate 21. The semiconductor device 30 includes the input switch 43, the first control circuit 42, and the band selection switch 41 for transmitting signals that are all provided at the first member 31. The second member 32 includes the radio-frequency amplifier circuit 50. The radio-frequency amplifier circuit 50 is constituted by two stages of a driver-stage amplifier circuit 51 and a power-stage amplifier circuit 52.

Additionally, the output matching circuit 60, the plurality of duplexers 70, the antenna switch 72, two band selection switches 73 for received signals, two low-noise amplifiers 71, an output-terminal selection switch 74 for received signals, and a second control circuit 75 are disposed at the module substrate 21. The radio-frequency module 20 transmits and receives signals in accordance with a frequency division duplex (FDD) system. FIG. 1A does not illustrate the band selection switches 73 for received signals, the output-terminal selection switch 74, and the second control circuit 75. In FIG. 2, the electronic circuits provided at the first member 31 are shaded with hatching in a relatively light color, and the electronic circuit provided at the second member 32 is shaded with hatching in a relatively dark color.

Two input-side contacts of the input switch 43 are respectively coupled to radio-frequency-signal input terminals IN1 and IN2 of the module substrate 21 via the conductive protrusions 35 (FIG. 1B) provided at the first member 31. In FIG. 2, connection points with the conductive protrusions 35 are indicated by white squares. Radio-frequency signals are inputted from the two radio-frequency-signal input terminals IN1 and IN2. The input switch 43 selects one contact from the two input-side contacts to cause a radio-frequency signal inputted to the selected contact to be inputted to the driver-stage amplifier circuit 51. An inter-member connection wire 36 is used to connect the input switch 43 and an input port of the driver-stage amplifier circuit 51. The inter-member connection wire 36 couple the electronic circuits provided at the first member 31 and the electronic circuit provided at the second member 32 without using the module substrate 21. The structure of the inter-member connection wire 36 will be explained in a description of a manufacturing process provided with reference to drawings in FIGS. 4A to 5D. In FIG. 2, connections with the inter-member connection wire 36 are indicated by thicker solid lines.

A radio-frequency signal amplified by the driver-stage amplifier circuit 51 is inputted to the power-stage amplifier circuit 52. A radio-frequency signal amplified by the power-stage amplifier circuit 52 is inputted via the output matching circuit 60 to an input-side contact of the band selection switch 41. An output port of the power-stage amplifier circuit 52 and the output matching circuit 60 are coupled to each other with the conductive protrusion 35 (FIG. 1B) provided at the second member 32 and the wire 22 (FIG. 1B) in the module substrate 21 interposed therebetween. The output matching circuit 60 and the input-side contact of the band selection switch 41 are coupled to each other via the wire 22 (FIG. 1B) provided in the module substrate 21 and the conductive protrusion 35 (FIG. 1B) provided at the first member 31. The band selection switch 41 selects one contact from a plurality of output-side contacts to cause a radio-frequency signal amplified by the power-stage amplifier circuit 52 to be outputted from the selected contact.

Two contacts of the plurality of output-side contacts of the band selection switch 41 are coupled to auxiliary output terminals PAAUX1 and PAAUX2 via the conductive protrusions 35 (FIG. 1B). The other six contacts are coupled to input ports for transmitting signals of the plurality of duplexers 70 prepared for different bands via the conductive protrusions 35 (FIG. 1B). The band selection switch 41 has a function of selecting one duplexer 70 from the plurality of duplexers 70 prepared for different bands.

The antenna switch 72 includes a plurality of circuit-side contacts and two antenna-side contacts. Two contacts of the plurality of circuit-side contacts of the antenna switch 72 are individually coupled to transmit-signal input terminals TRX1 and TRX2. The other six circuit-side contacts are respectively coupled to input-output common ports of the duplexers 70. The antenna-side two contacts are individually coupled to antenna terminals ANT1 and ANT2. An antenna is coupled to each of the antenna terminals ANT1 and ANT2.

The antenna switch 72 connects the two antenna-side contacts individually to two contacts selected from the plurality of circuit-side contacts. When a single band is used for communication, the antenna switch 72 connects one circuit-side contact to one antenna-side contact. A radio-frequency signal amplified by the radio-frequency amplifier circuit 50 and transferred through one duplexer 70 of a corresponding band is transmitted from an antenna coupled to the selected antenna-side contact.

The two band selection switches 73 for received signals each include four input-side contacts. Three contacts of the four input-side contacts of each of the two band selection switches 73 are individually coupled to output ports for received signals of the duplexers 70. The other one contact of each of the two band selection switches 73 is coupled to an auxiliary input terminal LNAAUX1 or LNAAUX2.

The two low-noise amplifiers 71 are prepared for the two band selection switches 73 for received signals. The two band selection switches 73 for received signals each cause a receive signal having passed through the duplexer 70 to be inputted to the corresponding low-noise amplifier 71.

Two circuit-side contacts of the output-terminal selection switch 74 are individually coupled to output ports of the two low-noise amplifiers 71. Three terminal-side contacts of the output-terminal selection switch 74 are individually coupled to receive-signal output terminals LNAOUT1, LNAOUT2, and LNAOUT3. A receive signal amplified by the low-noise amplifier 71 is outputted from a receive-signal output terminal selected by the output-terminal selection switch 74.

Supply voltage is applied to the driver-stage amplifier circuit 51 and the power-stage amplifier circuit 52 from power supply terminals VCC1 and VCC2 provided at the module substrate 21. The power supply terminals VCC1 and VCC2 are coupled to the radio-frequency amplifier circuit 50 via the conductive protrusions 35 (FIG. 1B) provided at the second member 32.

The first control circuit 42 are coupled to a power supply terminal VIO1, a control-signal terminal SDATA1, and a clock terminal SCLK1 via the conductive protrusions 35 (FIG. 1B) provided at the first member 31. The first control circuit 42 controls the radio-frequency amplifier circuit 50 in accordance with a control signal supplied to the control-signal terminal SDATA1. The inter-member connection wire 36 connects the first control circuit 42 and the radio-frequency amplifier circuit 50 to each other.

The second control circuit 75 is coupled to a power supply terminal VIO2, a control-signal terminal SDATA2, and a clock terminal SCLK2. The second control circuit 75 controls the low-noise amplifier 71, the band selection switches 73, and the output-terminal selection switch 74 in accordance with a control signal supplied to the control-signal terminal SDATA2.

A power supply terminal VBAT and a drain-voltage terminal VDD2 are provided at the module substrate 21. Power is supplied to a bias circuit of the radio-frequency amplifier circuit 50 and the first control circuit 42 from the power supply terminal VBAT. Supply voltage is applied to the low-noise amplifier 71 installed at the module substrate 21 from the drain-voltage terminal VDD2.

Figure 3A:
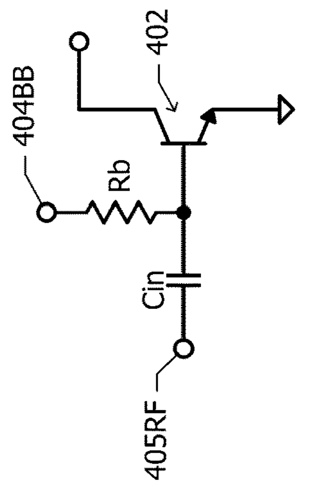
FIG. 3A is an equivalent circuit diagram of one cell constituting a power-stage amplifier circuit (FIG. 2) formed at a second member of the radio frequency module according to the first embodiment.

FIG. 3A is an equivalent circuit diagram of one cell constituting the power-stage amplifier circuit 52 (FIG. 2) formed at the second member 32. The power-stage amplifier circuit 52 includes a plurality of cells in parallel with each other. Each cell includes a transistor 402, an input capacitor Cin, and a ballast resistor element Rb. The base of the transistor 402 is coupled to a radio-frequency-signal input wire 405RF via the input capacitor Cin. The base of the transistor 402 is coupled to a base bias wire 404BB via the ballast resistor element Rb. The emitter of the transistor 402 is grounded. Supply voltage is applied to the collector of the transistor 402, and an amplified radio-frequency signal is outputted from the collector.

Figure 3B:
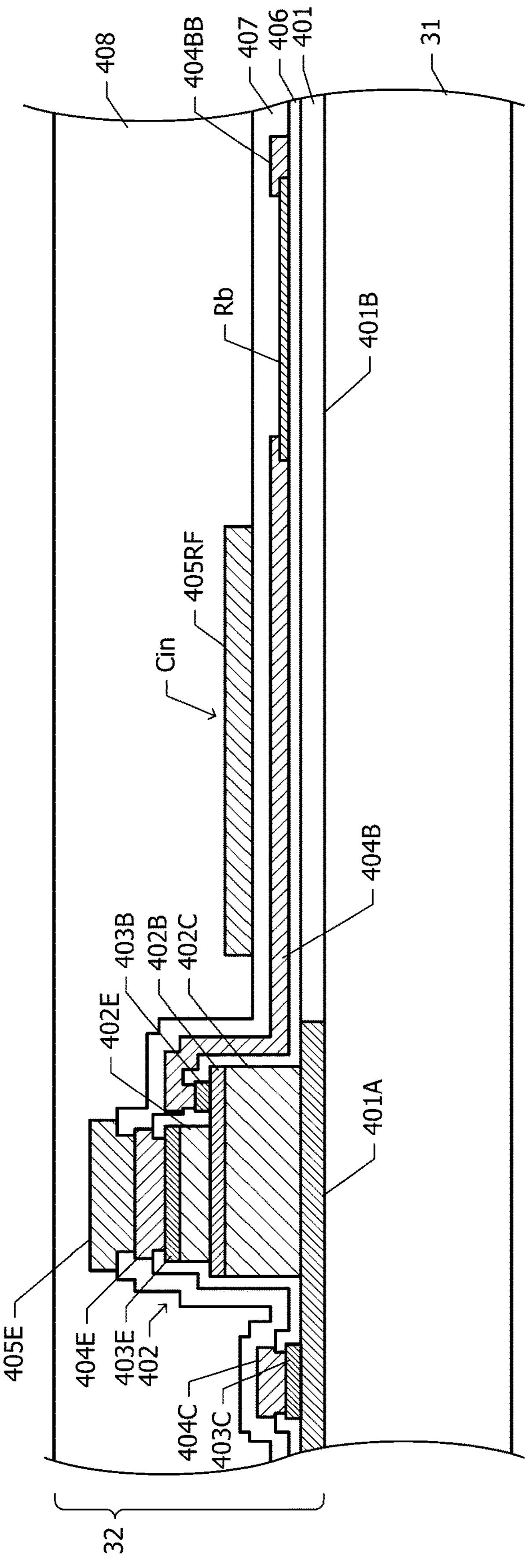
FIG. 3B is a sectional view of one cell constituting the power-stage amplifier circuit formed at the second member.

FIG. 3B is a sectional view of one cell constituting the power-stage amplifier circuit 52 formed at the second member 32. The first member 31 includes the semiconductor substrate such as a silicon substrate or SOI substrate, and a multilayer wiring structure formed on the semiconductor substrate. The band selection switch 41, the first control circuit 42, and the input switch 43 (FIG. 1A), which are not illustrated in FIG. 3B, are formed at the surface layer portion of the semiconductor substrate constituting the first member 31.

The second member 32 includes an underlying semiconductor layer 401. In the state in which the underlying semiconductor layer 401 is in surface contact with the first member 31, the second member 32 is joined to the first member 31. The underlying semiconductor layer 401 is divided into a conductive area 401A and an element isolation area 401B. The underlying semiconductor layer 401 may be made by using, for example, GaAs. The conductive area 401A is made of N-type GaAs. The element isolation area 401B is made by doping an impurity for non-conductivity to an N-type GaAs layer by ion implantation.

The transistor 402 is disposed on the conductive area 401A. The transistor 402 includes a collector layer 402C, a base layer 402B, and an emitter layer 402E, which are stacked on the conductive area 401A in order. The emitter layer 402E is disposed on a portion of the base layer 402B. For example, the collector layer 402C may be made of N-type GaAs, the base layer 402B may be made of P-type GaAs, and the emitter layer 402E may be made of N-type InGaP. This means that the transistor 402 is an HBT.

A base electrode 403B is disposed on the base layer 402B. The base electrode 403B is electrically coupled to the base layer 402B. An emitter electrode 403E is disposed on the emitter layer 402E. The emitter electrode 403E is electrically coupled to the emitter layer 402E. A collector electrode 403C is disposed on the conductive area 401A. The collector electrode 403C is electrically coupled to the collector layer 402C via the conductive area 401A.

A first-layer interlayer insulating film 406 is disposed on the underlying semiconductor layer 401 to cover the transistor 402, the collector electrode 403C, the base electrode 403B, and the emitter electrode 403E. The first-layer interlayer insulating film 406 may be made of, for example, an inorganic insulating material such as SiN. A plurality of openings are provided at the interlayer insulating film 406.

A first-layer emitter wire 404E, a base wire 404B, a collector wire 404C, the base bias wire 404BB, and the ballast resistor element Rb are disposed on the interlayer insulating film 406. The emitter wire 404E is coupled to the emitter electrode 403E through an opening provided at the interlayer insulating film 406. The base wire 404B is coupled to the base electrode 403B through another opening provided at the interlayer insulating film 406. The collector wire 404C is coupled to the collector electrode 403C through another opening provided at the interlayer insulating film 406.

The base wire 404B extends to an area not including the transistor 402. An end portion of the base wire 404B overlaps the ballast resistor element Rb in the area. The base wire 404B and the ballast resistor element Rb are electrically coupled to each other at the overlap. The other end portion of the ballast resistor element Rb overlaps the base bias wire 404BB. The ballast resistor element Rb and the base bias wire 404BB are electrically coupled to each other at the overlap.

A second-layer interlayer insulating film 407 is disposed over the interlayer insulating film 406 to cover the first-layer emitter wire 404E, the base wire 404B, the ballast resistor element Rb, and the base bias wire 404BB. The second-layer interlayer insulating film 407 may also be made of, for example, an inorganic insulating material such as SiN.

A second-layer emitter wire 405E and the radio-frequency-signal input wire 405RF are disposed on the interlayer insulating film 407. The second-layer emitter wire 405E is coupled to the first-layer emitter wire 404E through an opening provided at the interlayer insulating film 407. A portion of the radio-frequency-signal input wire 405RF overlaps the first-layer base wire 404B in plan view. The input capacitor Cin is formed at the area of the overlap of the radio-frequency-signal input wire 405RF and the first-layer base wire 404B.

A third-layer interlayer insulating film 408 is disposed to cover the second-layer emitter wire 405E and the radio-frequency-signal input wire 405RF. The third-layer interlayer insulating film 408 may be made of, for example, an organic insulating material such as polyimide.

Next, a method of manufacturing the semiconductor device 30 according to the first embodiment will be described with reference to drawings in FIGS. 4A to 5D. The drawings in FIGS. 4A to 5C are sectional views of the semiconductor device 30 during a manufacturing process. FIG. 5D is a sectional view of the finished semiconductor device 30.

Figure 4A:
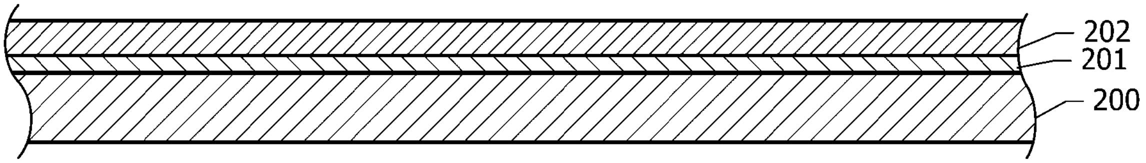
FIGS. 4A to 4F are sectional views of a semiconductor device during a manufacturing process.

As illustrated in FIG. 4A, a release layer 201 is epitaxially grown on a single-crystal base substrate 200 made from a compound semiconductor such as GaAs, and an element formation layer 202 is formed on the release layer 201. Elements including the electronic circuits of the radio-frequency amplifier circuit 50 formed at the second member 32 illustrated in FIG. 2 are formed at the element formation layer 202. These electronic circuits are formed in accordance with a general semiconductor manufacturing process. FIG. 4A does not illustrate the element structures formed at the element formation layer 202. In this stage, the element formation layer 202 is not divided into the individual second members 32.

Figure 4B:
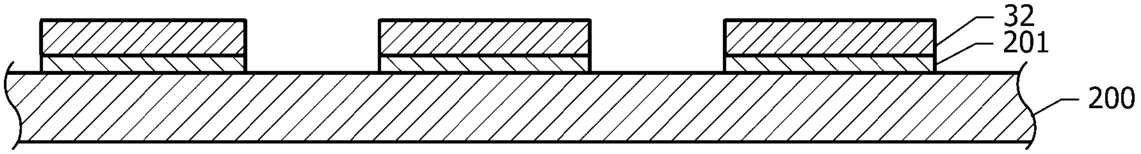

Next, as illustrated in FIG. 4B, the element formation layer 202 (FIG. 4A) and the release layer 201 are subjected to patterning by using a resist pattern (not illustrated in the drawing) as an etch mask. In this stage, the element formation layer 202 (FIG. 4A) is divided into the individual second members 32.

Figure 4C:
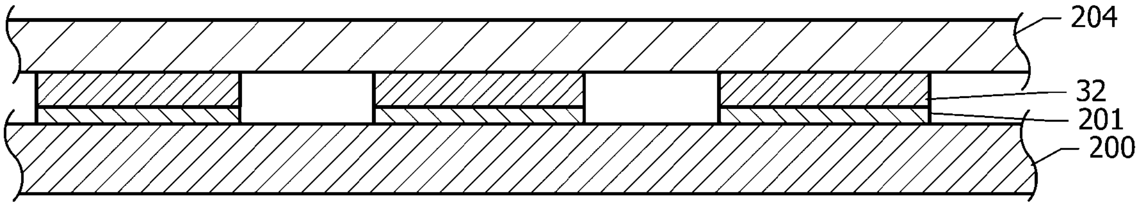

Next, as illustrated in FIG. 4C, a connecting support 204 is bonded on the divided second members 32. As a result, the plurality of second members 32 are connected to each other by the connecting support 204. The resist pattern used as an etch mask in the patterning step of FIG. 4B may be left so that the resist pattern exists between the second member 32 and the connecting support 204.

Figure 4D:
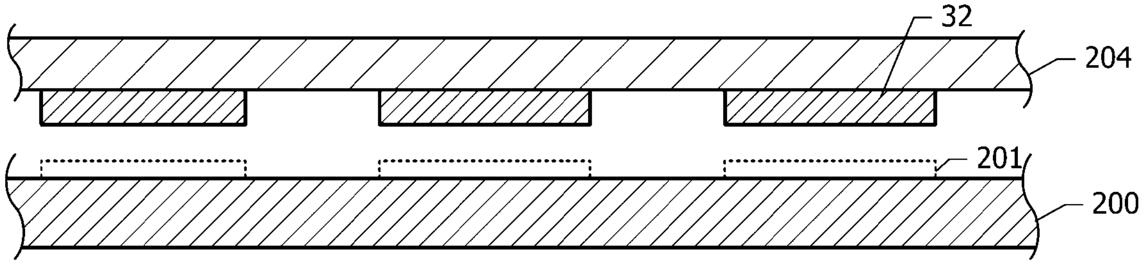

Next, as illustrated in FIG. 4D, the release layer 201 corresponding to the base substrate 200 and the second member 32 is selectively etched. As a result, the second member 32 and the connecting support 204 are released from the base substrate 200. To selectively etch the release layer 201, the release layer 201 is formed from a compound semiconductor having an etch resistance different from both the etch resistance of the base substrate 200 and the etch resistance of the second member 32.

Figure 4E:
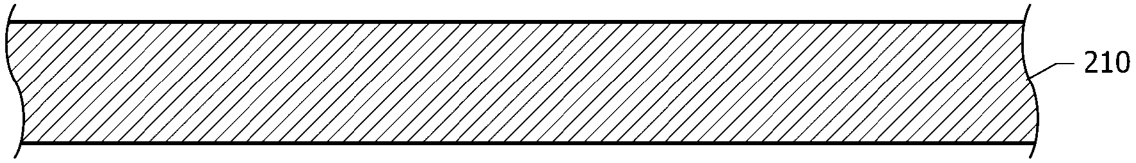

As illustrated in FIG. 4E, a substrate 210 including, for example, the band selection switch 41, the first control circuit 42, and the input switch 43 (FIG. 1A) provided at the first member 31 is prepared. In this stage, the substrate 210 is not divided into the individual first members 31.

Figure 4F:
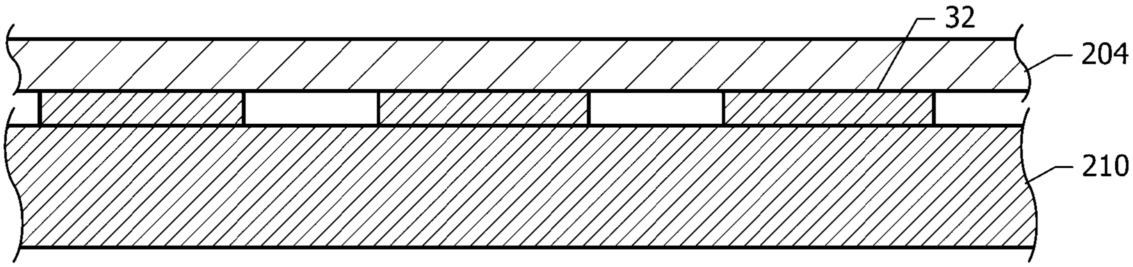

As illustrated in FIG. 4F, the second members 32 are joined to the substrate 210. The second member 32 and the substrate 210 are joined to each other by the Van der Waals force or hydrogen bonding. The second member 32 may be joined to the substrate 210 by, for example, static electricity, covalent bonding, or eutectic alloy bonding. For example, when a portion of a surface of the substrate 210 is made of Au, pressure may be applied in the state in which the second member 32 is in close contact with the Au area so as to join the second member 32 and the substrate 210.

Figure 5A:
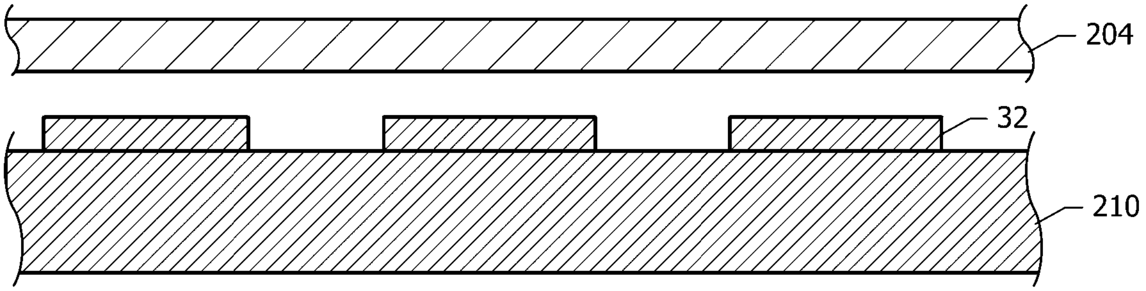
FIGS. 5A to 5C are sectional views of the semiconductor device during the manufacturing process.
Figure 5B:
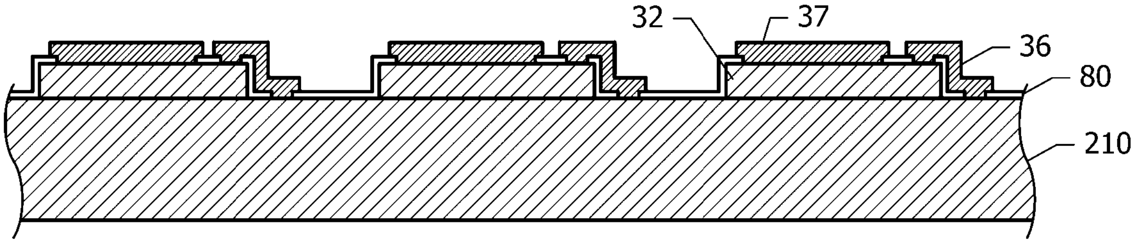

Next, as illustrated in FIG. 5A, the connecting support 204 is released from the second member 32. After the connecting support 204 is released, as illustrated in FIG. 5B, an interlayer insulating film 80 and a redistribution layer are formed over the substrate 210 and the second member 32. The redistribution layer includes the inter-member connection wire 36 and a pad 37.

Figure 5C:
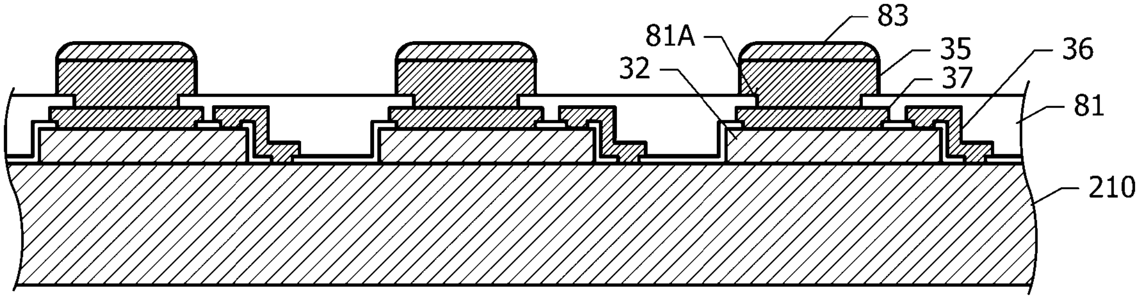
Figure 5D:
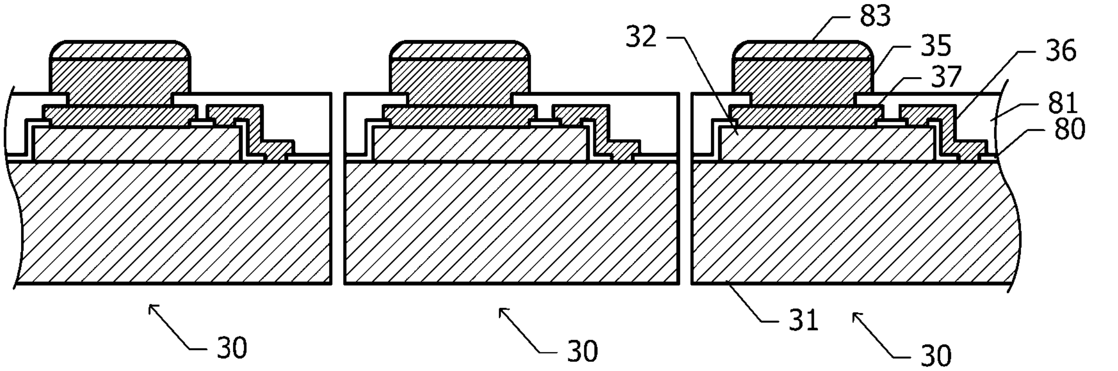
FIG. 5D is a sectional view of the finished semiconductor device.

Next, as illustrated in FIG. 5C, a protection film 81 is formed on the redistribution layer, and, for example, openings 81A are formed at the protection film 81. After this, the conductive protrusions 35 are formed in the openings 81A and on the protection film 81. The reflow process is performed in the state in which solder joints 83 are laid on top surfaces of the conductive protrusions 35.

Finally, as illustrated in FIG. 5D, the substrate 210 is cut with a dicing machine. As a result, individual pieces of the semiconductor devices 30 can be obtained. The first member 31 of each of the individual semiconductor devices 30 are larger than the second member 32 in plan view. The individual semiconductor device 30 is flip-chip mounted on or in the module substrate 21 (FIGS. 1A and 1B).

Next, advantageous effects of the first embodiment will be described. In the first embodiment, the single semiconductor device 30 is formed by stacking the first member 31 including the semiconductor elements made of an elemental semiconductor and the second member 32 including the semiconductor element made of a compound semiconductor. As a result, the radio-frequency module 20 can be smaller than if the two members are separately mounted on or in the module substrate 21. Further, because the band selection switch 41 is provided at the first member 31, the radio-frequency module 20 can be smaller than if the band selection switch 41 is individually mounted on or in the module substrate 21.

Moreover, two heat transfer paths are formed; one is a heat transfer path along which heat generated at the transistor 402 (FIG. 3B) included in the second member 32 is transferred to the first member 31 (FIGS. 1B and 5D); and the other is a heat transfer path along which the heat is transferred through the conductive protrusion 35 (FIG. 5D) to the module substrate 21 (FIG. 1B). The first member 31, which is larger than the second member 32, and the module substrate 21 function as a heat sink, and as a result, it is possible to improve the characteristic of heat released from the transistor 402.

Further, in the first embodiment, the semiconductor device 30 is disposed in close proximity to the output matching circuit 60. For example, no circuit component is disposed in the area 24 (FIG. 1A) between the semiconductor device 30 and the output matching circuit 60 in plan view. This can shorten the transfer line from the radio-frequency amplifier circuit 50 to the output matching circuit 60 and the transfer line from the output matching circuit 60 to the band selection switch 41, which are illustrated in FIG. 2. Shortening the transfer lines can reduce the transfer loss of radio-frequency signal. As a result, it is possible to achieve highly efficient performance.

To shorten the transfer line from the radio-frequency amplifier circuit 50 to the output matching circuit 60 and the transfer line from the output matching circuit 60 to the band selection switch 41, it is preferable that the second member 32 and the band selection switch 41 be offset from the geometrical center of the first member 31 toward the output matching circuit 60 in plan view.

Second Embodiment

Next, a radio-frequency module according to a second embodiment will be described with reference to FIGS. 6A to 7B. The following description does not repeat configurations common to the radio-frequency module according to the first embodiment described with reference to FIGS. 1A to 5D.

Figure 6A:
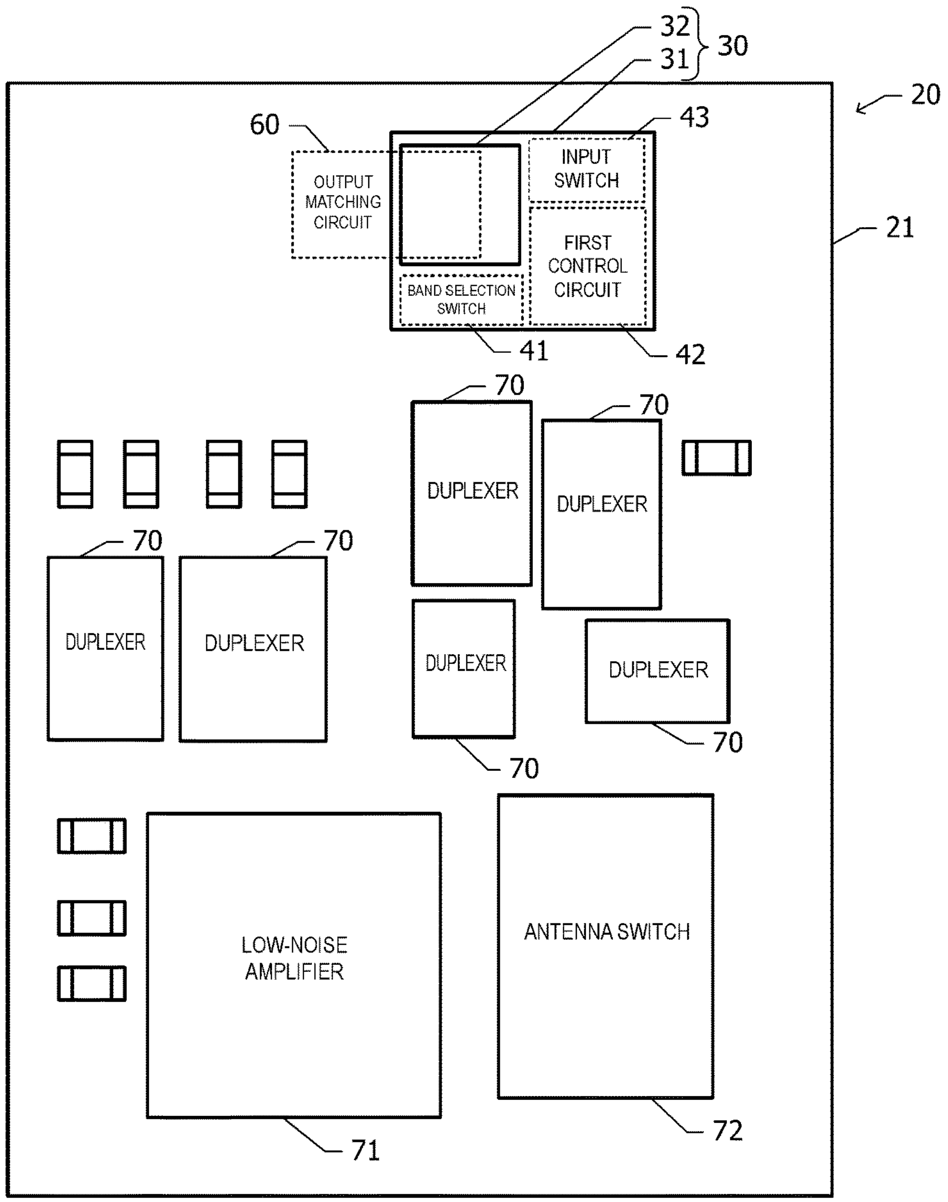
FIG. 6A illustrates an arrangement of constituent elements of a radio-frequency module according to a second embodiment in plan view.
Figure 6B:
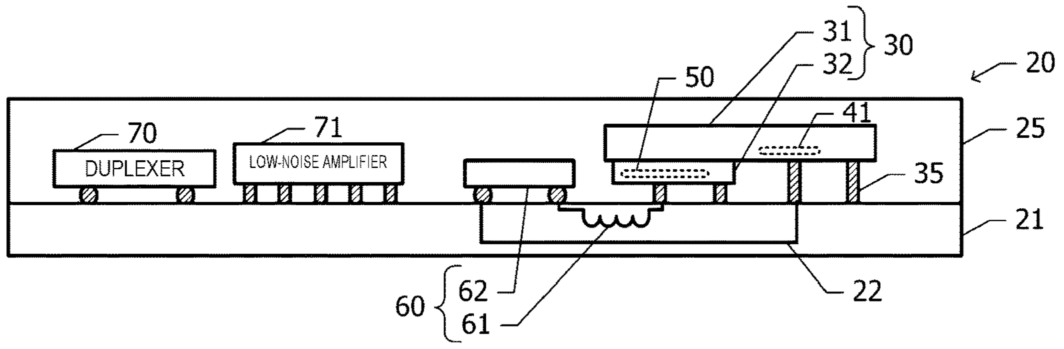
FIG. 6B schematically illustrates a sectional structure of the radio-frequency module.

FIG. 6A illustrates an arrangement of constituent elements of the radio-frequency module 20 according to the second embodiment in plan view. FIG. 6B schematically illustrates a sectional structure of the radio-frequency module 20. In the first embodiment (FIG. 1A), the semiconductor device 30 does not overlap the output matching circuit 60 in plan view, but the semiconductor device 30 is disposed in close proximity to the output matching circuit 60. By contrast, in the second embodiment, the semiconductor device 30 overlaps at least a portion of one or some passive elements of the plurality of passive elements included in the output matching circuit 60 in plan view.

As illustrated in FIG. 6B, the output matching circuit 60 includes an inductor 61 and a capacitor 62. The inductor 61 is formed by a metal pattern disposed on or in the module substrate 21. An individual surface mount device mounted on or in the module substrate 21 is used as the capacitor 62. In plan view, the inductor 61 at least partially overlaps the semiconductor device 30, and the capacitor 62 is disposed in close proximity to the semiconductor device 30. The capacitor 62 and the semiconductor device 30 are next to each other in plan view. For example, no circuit component is disposed between the semiconductor device 30 and a closest surface-mount passive element of the surface-mount passive elements included in the output matching circuit 60 to the semiconductor device 30.

Figure 7A:
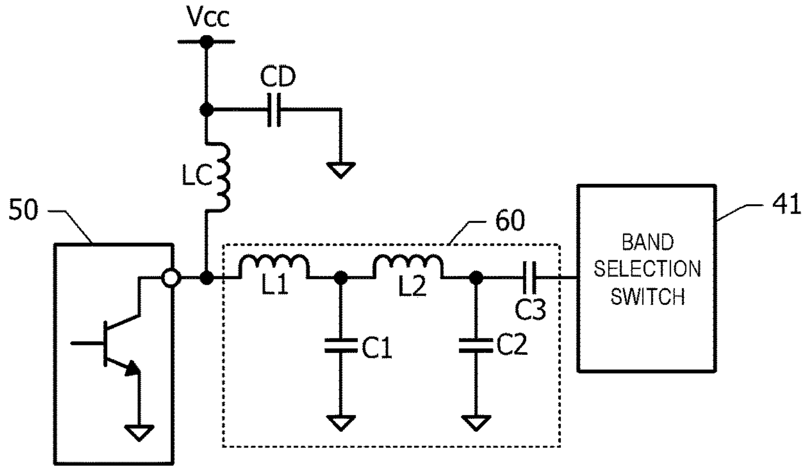
FIG. 7A is an equivalent circuit diagram illustrating an example of an output matching circuit of the radio-frequency module according to the second embodiment.

FIG. 7A is an equivalent circuit diagram illustrating an example of the output matching circuit 60. Series-connected inductors L1 and L2 and a series-connected capacitor C3 are coupled in series with each other between an output port of the radio-frequency amplifier circuit 50 and the band selection switch 41. A ground-connected capacitor C1 is coupled between the series-connected inductors L1 and L2. A ground-connected capacitor C2 is coupled between the series-connected inductor L2 and the series-connected capacitor C3. A supply voltage Vcc is applied to the output port of the radio-frequency amplifier circuit 50 through a choke coil LC. A decoupling capacitor CD is coupled between the supply voltage Vcc and the ground.

Figure 7B:
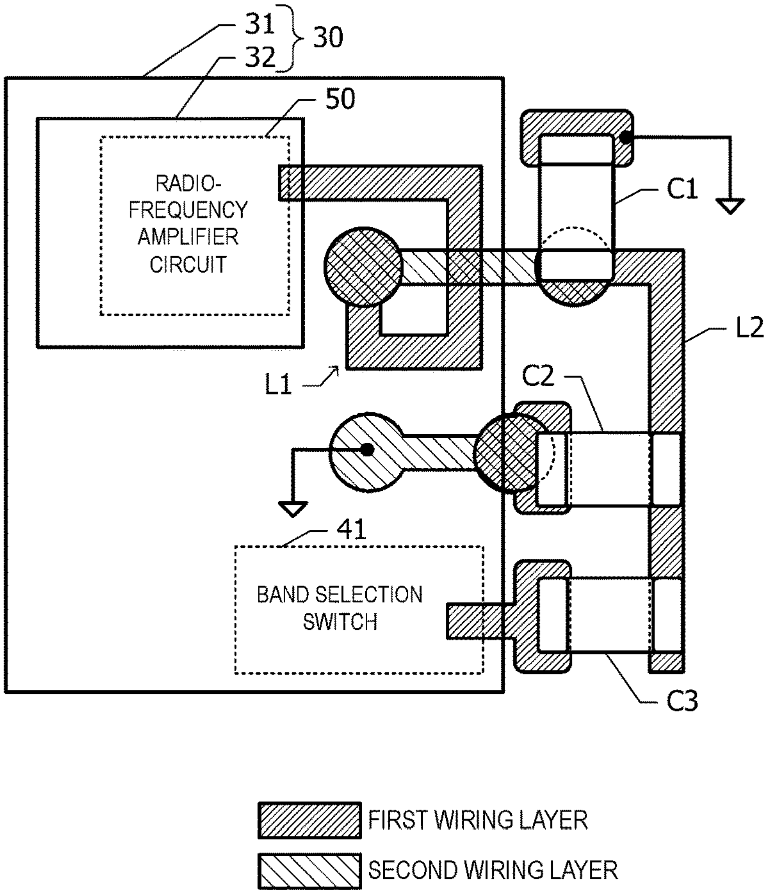
FIG. 7B illustrates an example of a planar arrangement of constituent elements of the output matching circuit.

FIG. 7B illustrates an example of a planar arrangement of the constituent elements of the output matching circuit 60. In FIG. 7B, metal patterns in a first wiring layer of the module substrate 21 (FIG. 6B) are shaded with hatching in dark diagonal lines from upper right to lower left, and metal patterns in a second wiring layer deeper than the first wiring layer are shaded with hatching in light diagonal lines from upper left to lower right. In the circular area at which a metal pattern in the first wiring layer overlaps a metal pattern in the second wiring layer, a via connecting the metal patterns is positioned. The output matching circuit 60 includes passive elements formed by metal patterns disposed on or in the module substrate 21 and surface-mount passive elements (SMDs) mounted on or in the module substrate 21.

The series-connected inductor L1 is formed by a spiral metal pattern in the first wiring layer. The semiconductor device 30 includes the series-connected inductor L1 in plan view. The metal pattern forming the series-connected inductor L1 may be shaped as a meander. The other series-connected inductor L2 is formed by a metal pattern in the first wiring layer disposed outside the semiconductor device 30 in plan view.

Individual surface-mount passive elements (SMDs) are used as the ground-connected capacitors C1 and C2 and the series-connected capacitor C3. No circuit component is disposed between the semiconductor device 30 and a closest passive element of the plurality of individual surface-mount passive elements constituting the output matching circuit 60, namely, the ground-connected capacitors C1 and C2 and the series-connected capacitor C3 to the semiconductor device 30. No circuit component is disposed between the semiconductor device 30 and a closest passive element of the passive elements disposed outside the semiconductor device 30 in plan view out of the plurality of passive elements constituting the output matching circuit 60, namely, the ground-connected capacitors C1 and C2, the series-connected capacitor C3, and the series-connected inductor L2 to the semiconductor device 30. The area between the series-connected inductor L2 and the semiconductor device 30 does not include any circuit component not constituting the output matching circuit 60.

Next, advantageous effects of the second embodiment will be described. Because in the second embodiment a portion of the output matching circuit 60 overlaps the semiconductor device 30 in plan view, the radio-frequency module can be further miniaturized. Furthermore, similarly to the first embodiment, it is possible to achieve the effect of improving the characteristic of heat release and the effect of reducing transfer loss.

Next, modifications of the second embodiment will be described. The series-connected inductor L2 is implemented by a metal pattern provided at the module substrate 21 in the second embodiment, but the series-connected inductor L2 may be implemented by an individual surface mount device. Surface mount devices are used for all the ground-connected capacitors C1 and C2 and the series-connected capacitor C3 in the second embodiment, but the capacitors may be partially implemented by the built-in capacitance of the band selection switch 41. Another example of configuration is that digitally tunable capacitors may be used as the ground-connected capacitors C1 and C2 and the series-connected capacitor C3.

It is preferable that a passive element for high Q factor be implemented by a metal pattern in the module substrate 21 or a surface mount device. A passive element without need for high Q factor may be provided at the first member 31. For example, the series-connected capacitor C3 is not required to achieve high Q factor as compared to the other passive elements. Thus, the series-connected capacitor C3 can be formed at the first member 31.

Third Embodiment

Next, a radio-frequency module according to a third embodiment will be described with reference to FIGS. 8A and 8B. The following description does not repeat configurations common to the radio-frequency module according to the second embodiment described with reference to FIGS. 6A to 7B.

Figure 8A:
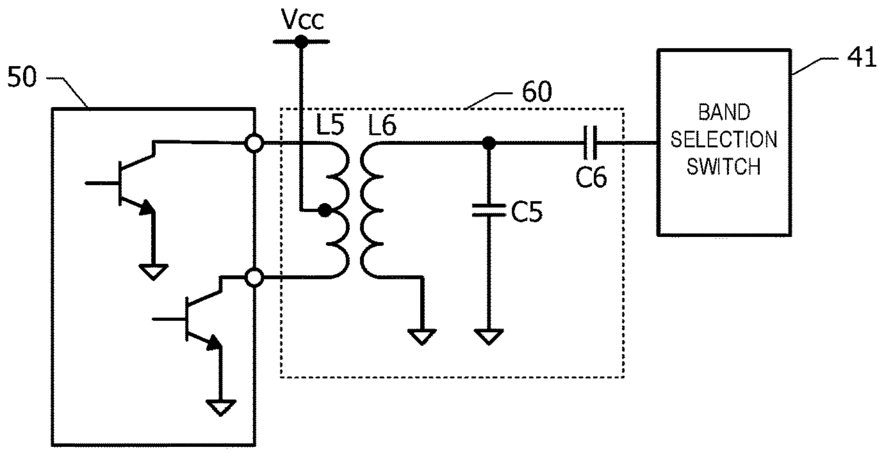
FIG. 8A is an equivalent circuit diagram illustrating an example of an output matching circuit of a radio-frequency module according to a third embodiment.

FIG. 8A is an equivalent circuit diagram illustrating an example of the output matching circuit 60. A single-ended amplifier circuit is used as the radio-frequency amplifier circuit 50 in the second embodiment, but a differential amplifier circuit is used as the radio-frequency amplifier circuit 50 in the third embodiment. The radio-frequency amplifier circuit 50 has two output ports for outputting differential signals. The output matching circuit 60 includes an output transformer having a primary coil L5 and a secondary coil L6, a ground-connected capacitor C5, and a series-connected capacitor C6.

The primary coil L5 of the output transformer is coupled between the two output ports. A center tap of the primary coil L5 is coupled to the supply voltage Vcc. One end portion of the secondary coil L6 of the output transformer is coupled to the band selection switch 41 via the series-connected capacitor C6. The one end portion of the secondary coil L6 is also grounded via the ground-connected capacitor C5. The other end portion of the secondary coil L6 is grounded.

Figure 8B:
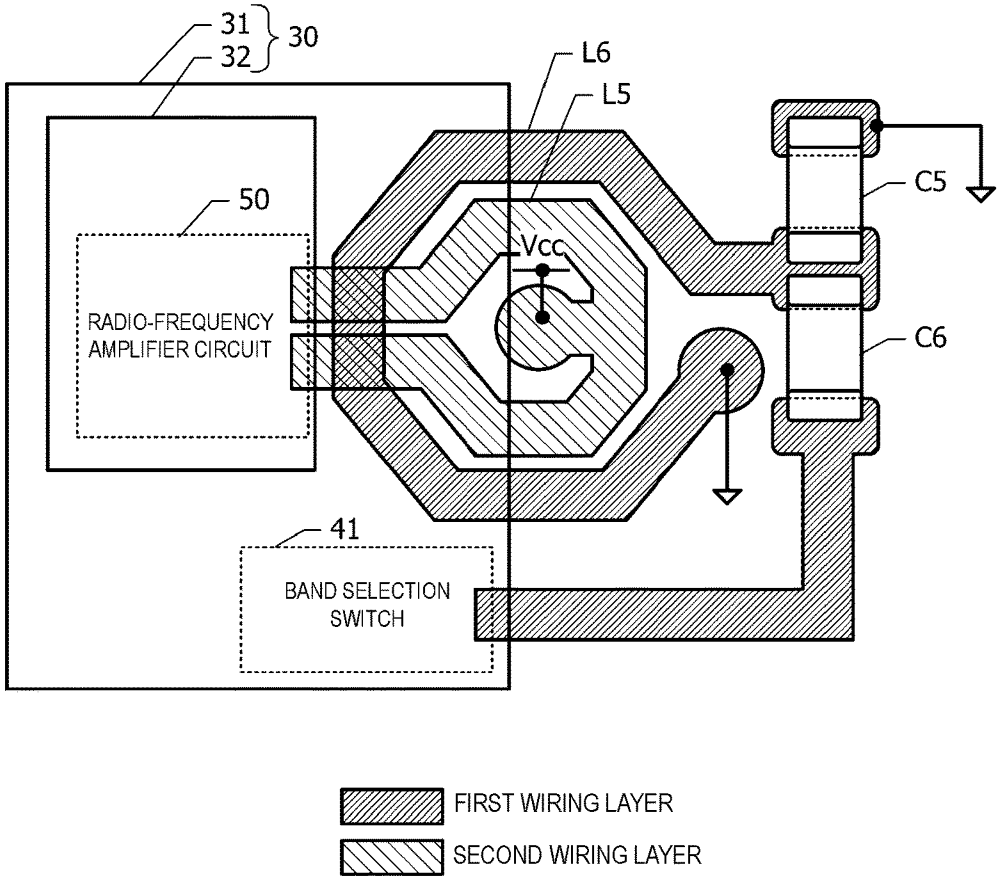
FIG. 8B illustrates an example of a planar arrangement of constituent elements of the output matching circuit.

FIG. 8B illustrates an example of a planar arrangement of the constituent elements of the output matching circuit 60. In FIG. 8B, metal patterns in the first wiring layer of the module substrate 21 (FIG. 6B) are shaded with hatching in dark diagonal lines from upper right to lower left, and a metal pattern in the second wiring layer is shaded with hatching in light diagonal lines from upper left to lower right. The metal pattern in the second wiring layer forms the primary coil L5. The secondary coil L6 formed by a metal pattern in the first wiring layer is disposed around the primary coil L5. Instead of the structure in which the secondary coil L6 is disposed around the primary coil L5, the primary coil L5 may substantially overlap the secondary coil L6 in plan view. Individual surface mount devices are used as the ground-connected capacitor C5 and the series-connected capacitor C6. Both the primary coil L5 and the secondary coil L6 partially overlap the semiconductor device 30 in plan view.

Next, advantageous effects of the third embodiment will be described. Similarly to the second embodiment, because in the third embodiment a portion of the output matching circuit 60 also overlaps the semiconductor device 30 in plan view, the radio-frequency module can be further miniaturized. Furthermore, similarly to the second embodiment, it is possible to achieve the effect of improving the characteristic of heat release and the effect of reducing transfer loss.

Fourth Embodiment

Next, a radio-frequency module according to a fourth embodiment will be described with reference to FIG. 9A. The following description does not repeat configurations common to the radio-frequency module according to the first embodiment described with reference to FIGS. 1A to 5D.

Figure 9A:
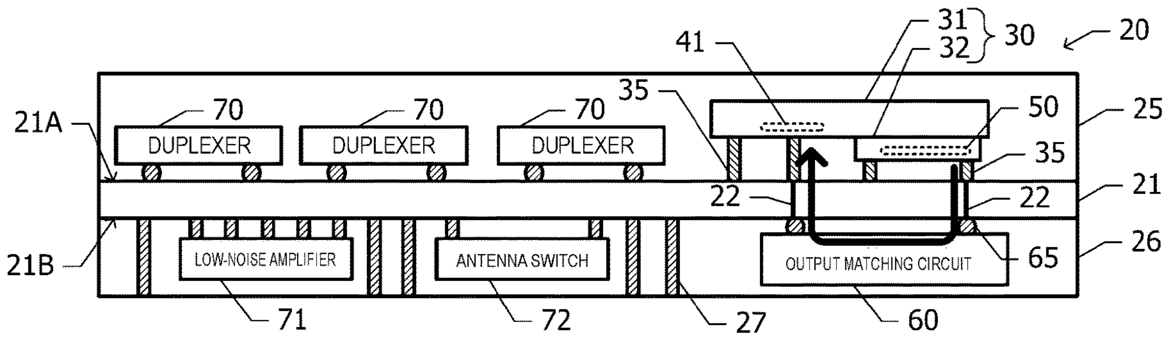
FIGS. 9A and 9B schematically illustrate a sectional structure of a radio-frequency module according to a fourth embodiment and a sectional structure of a radio-frequency module according to a modification of the fourth embodiment.

FIG. 9A schematically illustrates a sectional structure of the radio-frequency module 20 according to the fourth embodiment. A printed circuit board with elements on one side is used as the module substrate 21 in the first embodiment, but a printed circuit board with elements on both sides is used as the module substrate 21 in the fourth embodiment.

The semiconductor device 30 and the plurality of duplexers 70 are mounted on a first surface 21A that is one surface of the module substrate 21. The output matching circuit 60, the low-noise amplifier 71, and the antenna switch 72 are mounted on a second surface 21B opposite to the first surface 21A. An integrated passive device is used as the output matching circuit 60. The output matching circuit 60 may be implemented by a plurality of surface mount devices. The output matching circuit 60 overlaps the semiconductor device 30 in plan view. When the output matching circuit 60 is implemented by a plurality of surface mount devices, at least one or some surface mount devices of the plurality of surface mount devices overlap the semiconductor device 30 in plan view.

The radio-frequency amplifier circuit 50 formed at the second member 32 is coupled to the output matching circuit 60 via the conductive protrusion 35 raised from the second member 32, the wire 22 extending from the first surface 21A to the second surface 21B in the module substrate 21, and the solder bump 65 of the output matching circuit 60. The output matching circuit 60 is further coupled to the band selection switch 41 via another solder bump 65, another wire 22, and the conductive protrusion 35 raised from the first member 31. The solder bumps 65 can be replaced with conductive protrusions having another kind of structure such as Cu pillar bumps, pillars, or posts.

A plurality of conductive columns 27 are attached to the second surface 21B of the module substrate 21 in such a manner that the plurality of conductive columns 27 are almost perpendicular to the second surface 21B. The elements mounted on the first surface 21A of the module substrate 21 such as the semiconductor device 30 and the duplexers 70 are sealed by the molding resin 25. The elements mounted on the second surface 21B such as the output matching circuit 60, the low-noise amplifier 71, and the antenna switch 72 are sealed by a molding resin 26. An end of each of the plurality of conductive columns 27 is exposed from the surface of the molding resin 26. The surface of the exposed end of each of the plurality of conductive columns 27 is used as an electrode terminal for establishing connection with, for example, a motherboard. A ball bump (also referred to as solder bump) made of solder may be deposited on the surface of the exposed end of each of the plurality of conductive columns 27. For example, a Cu pillar bump or a pillar may be disposed on the exposed surface of each of the plurality of conductive columns 27. Another example is that, for example, Cu pillar bumps, pillars, or solder bumps may be used as a replacement for the conductive columns 27.

Next, advantageous effects of the fourth embodiment will be described. In the fourth embodiment, the semiconductor device 30 and the output matching circuit 60 are respectively disposed on different sides across the module substrate 21, and the semiconductor device 30 and the output matching circuit 60 overlap in plan view. This structure can further shorten the wire 22 connecting the radio-frequency amplifier circuit 50 of the semiconductor device 30 and the output matching circuit 60 and the wire 22 connecting the output matching circuit 60 and the band selection switch 41. In FIG. 9A, a curved line with an arrow indicates the transfer path of radio-frequency signal from the radio-frequency amplifier circuit 50 via the output matching circuit 60 to the band selection switch 41. Because the transfer path is relatively short, it is possible to reduce the transfer loss of radio-frequency signal and achieve highly efficient performance. Furthermore, also in the fourth embodiment, it is possible to improve the characteristic of heat release and achieve miniaturization, similarly to the first embodiment.

Next, the radio-frequency module 20 according to a modification of the fourth embodiment will be described with reference to FIG. 9B.

Figure 9B:
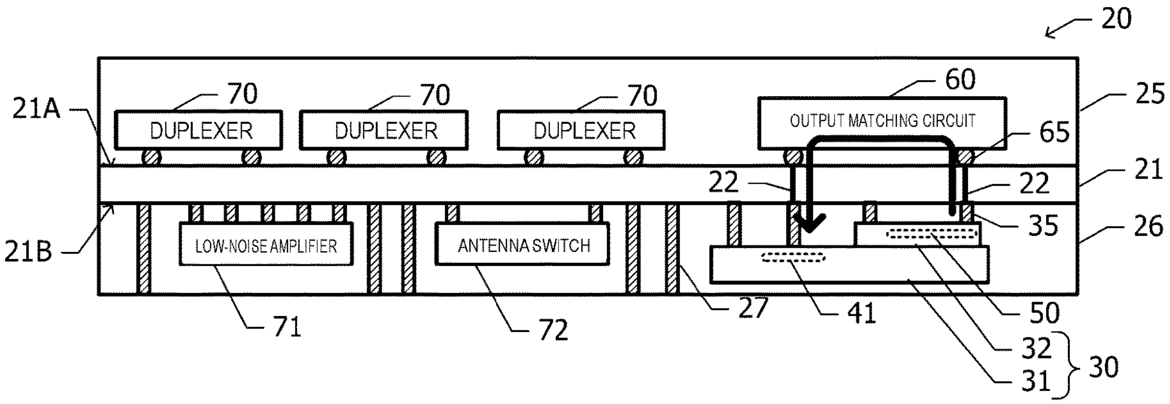

FIG. 9B schematically illustrates a sectional structure of the radio-frequency module 20 according to a modification of the fourth embodiment. In the fourth embodiment (FIG. 9A), the semiconductor device 30 is mounted on the first surface 21A of the module substrate 21, and the output matching circuit 60 is mounted on the second surface 21B, that is, a surface facing the motherboard when the radio-frequency module 20 is mounted on or in the motherboard. By contrast, in this modification, the semiconductor device 30 is mounted on the second surface 21B of the module substrate 21, that is, the surface facing the motherboard when the radio-frequency module 20 is mounted on or in the motherboard. The output matching circuit 60 is mounted on the first surface 21A opposite to the second surface 21B having the semiconductor device 30. Also in this modification, the output matching circuit 60 overlaps the semiconductor device 30 in plan view. Also in FIG. 9B, similarly to FIG. 9A, a curved line with an arrow indicates the transfer path of radio-frequency signal.

As illustrated in the fourth embodiment and its modification, either the semiconductor device 30 or the output matching circuit 60 can be mounted on the surface facing the motherboard. In either case, the output matching circuit 60 is mounted on the surface opposite to the surface having the semiconductor device 30.

Fifth Embodiment

Next, a radio-frequency module according to a fifth embodiment will be described with reference to FIG. 10. The following description does not repeat configurations common to the radio-frequency module 20 (FIG. 9A) according to the fourth embodiment.

Figure 10:
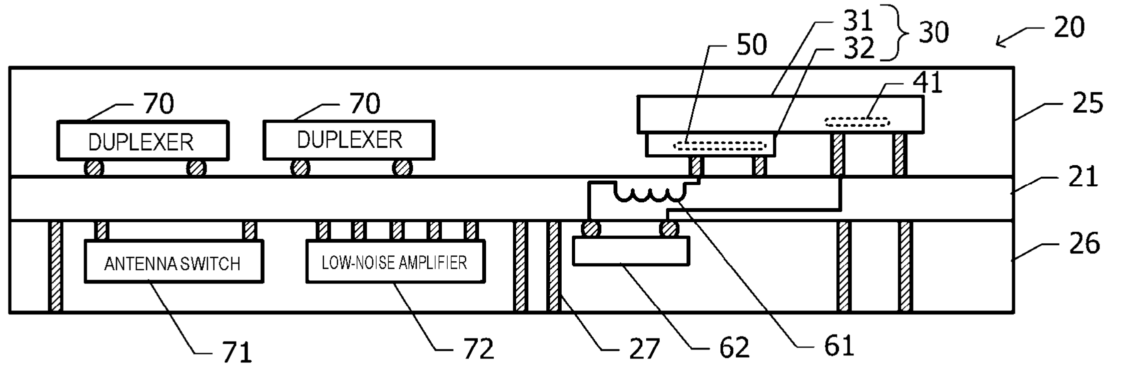
FIG. 10 schematically illustrates a sectional structure of a radio-frequency module according to a fifth embodiment.

FIG. 10 schematically illustrates a sectional structure of the radio-frequency module 20 according to the fifth embodiment. In the fourth embodiment, the output matching circuit 60 is constituted by an integrated passive device or a plurality of surface mount devices. By contrast, in the fifth embodiment, the inductor 61 included in the output matching circuit 60 is implemented by a metal pattern included in a wiring layer of the module substrate 21. An individual surface mount device is used as the capacitor 62. The surface mount device constituting the output matching circuit 60 is mounted on the surface opposite to the surface having the semiconductor device 30.

The inductor 61 at least partially overlaps the semiconductor device 30 in plan view. The capacitor 62 also at least partially overlaps the semiconductor device 30 in plan view.

Next, advantageous effects of the fifth embodiment will be described. Similarly to the fourth embodiment, the fifth embodiment can also miniaturize the radio-frequency module 20, achieve low loss, and improve the characteristic of heat release.

The embodiments described above are mere examples, and as might be expected, the configurations described in the different embodiments may be partially replaced or combined with each other. In particular, almost identical effects and advantages achieved by almost identical configurations in the plurality of embodiments are not mentioned in every embodiment. Moreover, the present disclosure is not limited to the embodiments described above. For example, various modifications, improvements, and combinations would be apparent to those skilled in the art.

What is claimed is:

1. A radio-frequency module comprising:
- a module substrate;
- a semiconductor device mounted on or in the module substrate, the semiconductor device including a radio-frequency amplifier circuit and a band selection switch; and
- an output matching circuit disposed on or in the module substrate, the output matching circuit being coupled between the radio-frequency amplifier circuit and the band selection switch, wherein
- the band selection switch is configured to output an inputted radio-frequency signal from a contact selected from a plurality of contacts,
- the semiconductor device includes
  - a first member including the band selection switch including a semiconductor element made of an elemental semiconductor,
  - a second member joined to the first member in surface contact with the first member, the second member including the radio-frequency amplifier circuit including a semiconductor element made of a compound semiconductor, and
  - a plurality of conductive protrusions arranged at positions included in the first member or the second member in plan view,
- the semiconductor device is mounted on or in the module substrate with the plurality of conductive protrusions interposed between the semiconductor device and the module substrate such that the second member faces the module substrate,
- the semiconductor device is disposed in a proximity to the output matching circuit in plan view, or the semiconductor device overlaps at least one passive element constituting the output matching circuit in plan view, and
- an output of the radio-frequency amplifier circuit is connected to an input of the output matching circuit, and an output of the output matching circuit is connected to an input of the band selection switch.

2. The radio-frequency module according to claim 1, wherein
- the output matching circuit includes a passive element configured by a metal pattern disposed on or in the module substrate, and
- the semiconductor device overlaps at least a portion of the metal pattern configuring the passive element of the output matching circuit in plan view.

3. The radio-frequency module according to claim 1, wherein
- the output matching circuit includes a passive element mounted on or in the module substrate, and
- the passive element included in the output matching circuit is mounted on a surface of the module substrate, and the surface is opposite to another surface having the semiconductor device.

4. The radio-frequency module according to claim 3, wherein
- the semiconductor device overlaps the passive element included in the output matching circuit in plan view.

5. The radio-frequency module according to claim 2, wherein
- the output matching circuit includes a passive element mounted on or in the module substrate, and
- the passive element included in the output matching circuit is mounted on a surface of the module substrate, and the surface is opposite to another surface having the semiconductor device.

6. The radio-frequency module according to claim 5, wherein
- the semiconductor device overlaps the passive element included in the output matching circuit in plan view.

7. The radio-frequency module according to claim 1, further comprising:
- an input switch that is controlled to select, from a plurality of radio-frequency signals input to the plurality of contacts, the inputted radio-frequency signal that is input to the band selection switch.

* * * * *